(12) United States Patent
Zheng et al.

(10) Patent No.: US 11,967,664 B2
(45) Date of Patent: Apr. 23, 2024

(54) PHOTODIODES WITH SERPENTINE SHAPED ELECTRICAL JUNCTION

(71) Applicant: GlobalFoundries Singapore Pte. Ltd., Singapore (SG)

(72) Inventors: Ping Zheng, Singapore (SG); Eng Huat Toh, Singapore (SG); Cancan Wu, Singapore (SG); Kiok Boone Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 38 days.

(21) Appl. No.: 17/659,850

(22) Filed: Apr. 20, 2022

(65) Prior Publication Data

US 2023/0343886 A1    Oct. 26, 2023

(51) Int. Cl.
*H01L 31/107*    (2006.01)

(52) U.S. Cl.
CPC .................. *H01L 31/1075* (2013.01)

(58) Field of Classification Search
CPC ........... H01L 31/1075; H01L 27/14643; H01L 27/14625; H01L 31/107
See application file for complete search history.

(56) References Cited

U.S. PATENT DOCUMENTS

| | | | |
|---|---|---|---|
| 2010/0019295 A1* | 1/2010 | Henderson | H01L 31/107 257/E27.122 |
| 2010/0127314 A1* | 5/2010 | Frach | H01L 31/1804 257/292 |
| 2013/0193546 A1* | 8/2013 | Webster | H01L 31/02363 257/438 |
| 2018/0108799 A1* | 4/2018 | Stark | H01L 31/1804 |
| 2018/0108800 A1* | 4/2018 | Morimoto | B60W 30/00 |
| 2019/0181177 A1* | 6/2019 | Kobayashi | H01L 27/14636 |
| 2020/0028018 A1* | 1/2020 | Iwata | G01S 17/89 |
| 2020/0105958 A1* | 4/2020 | Sasago | H01L 27/1461 |
| 2020/0135776 A1* | 4/2020 | Finkelstein | H01L 27/14636 |
| 2020/0279877 A1* | 9/2020 | Kim | H01L 27/1464 |
| 2020/0295218 A1* | 9/2020 | Wakano | H01L 31/107 |
| 2021/0296377 A1* | 9/2021 | Lu | H01L 27/1462 |
| 2022/0115552 A1* | 4/2022 | Lim | H01L 31/18 |
| 2022/0130877 A1* | 4/2022 | Abdelghafar | G01S 7/4863 |
| 2022/0140156 A1* | 5/2022 | Yagi | H01L 31/107 356/5.01 |
| 2022/0149087 A1* | 5/2022 | Lu | H01L 27/14689 |
| 2022/0163674 A1* | 5/2022 | Matsumoto | H01L 31/0232 |
| 2022/0181366 A1* | 6/2022 | Yagi | H04N 25/702 |
| 2022/0302183 A1* | 9/2022 | Abdelghafar | H01L 27/1463 |

(Continued)

OTHER PUBLICATIONS

Liu et al., 2-D Photon-Detection-Probability Simulation and a Novel Guard-Ring Design for Small CMOS Single-Photon Avalanche Diodes, IEEE Transactions on Electron Devices, 2021, pp. 1-6, IEEE.

(Continued)

*Primary Examiner* — Bitew A Dinke
(74) *Attorney, Agent, or Firm* — Anthony Canale

(57) ABSTRACT

The present disclosure generally relates to semiconductor devices for use in optoelectronic/photonic applications and integrated circuit (IC) chips. More particularly, the present disclosure relates to photodiodes such as avalanche photodiodes (APDs) and single photon avalanche diodes (SPADs).

20 Claims, 8 Drawing Sheets

(56) References Cited

U.S. PATENT DOCUMENTS

| | | | | |
|---|---|---|---|---|
| 2022/0344388 A1* | 10/2022 | Ebiko | ................ | H01L 27/1463 |
| 2022/0406823 A1* | 12/2022 | Wang | ................ | H01L 31/02325 |
| 2023/0215884 A1* | 7/2023 | Sekine | .............. | H01L 27/14634 |
| | | | | 257/438 |
| 2023/0290672 A1* | 9/2023 | Chou | ................ | H01L 27/14643 |
| | | | | 257/510 |

OTHER PUBLICATIONS

Gramuglia et al., Engineering Breakdown Probability Profile for PDP and DCR Optimization in a SPAD Fabricated in a Standard 55 nm BCD Process, IEEE Journal of Selected Topics in Quantum Electronics, Mar./Apr. 2022, pp. 1-20, vol. 28, No. 2, IEEE.

Poushi et al., Experimental and simulation study of fill-factor enhancement using a virtual guard ring in n+/p-well CMOS single-photon avalanche diodes, Optical Engineering, Jun. 2021, pp. 067105-1 to 067105-11, vol. 60—Issue No. 6, SPIE.

Henderson et al., A Dual-Junction Single-Photon Avalanche Diode in 130-nm CMOS Technology, IEEE Electron Device Letters, Mar. 2013, pp. 429-431, vol. 34, No. 3, IEEE.

* cited by examiner

PHOTODIODES WITH SERPENTINE SHAPED ELECTRICAL JUNCTION

FIELD OF THE INVENTION

The present disclosure generally relates to semiconductor devices for use in optoelectronic/photonic applications and integrated circuit (IC) chips. More particularly, the present disclosure relates to photodiodes such as avalanche photodiodes (APDs) and single photon avalanche diodes (SPADs).

BACKGROUND

Optoelectronic or photonic devices are a type of semiconductor device that detects and harnesses electromagnetic energy such as light. The use of such devices in high-speed switching and transceiver devices in data communications are but a few examples that highlight the advantages of processing both optical and electrical signals within a single integrated circuit (IC) device. Examples of an optoelectronic device include single photon avalanche diodes (SPADs) and avalanche photodiodes (APDs). These types of photodiodes exploit the photon-triggered avalanche current of a reverse biased P-N junction to detect electromagnetic waves.

Photodiodes, such as SPADs, may have high breakdown voltages and therefore may require the use of high voltages for their operations, which consumes more power. Additionally, photodiodes may be typically fabricated using complementary metal-oxide-semiconductor (CMOS) technologies, which have limited space on the device substrate, and may result in the photodiodes having relatively low fill-factors (i.e., the ratio of photo-sensitive area to total imaging or pixel area). Furthermore, these photodiodes may suffer from low photon detection probability (PDP) due to the lower absorption coefficient of silicon in near-infrared wavelengths. Hence, the design of an efficient photodiode is a difficult problem, and improved photodiode designs are needed.

SUMMARY

In an aspect of the present disclosure, there is provided a photodiode including an epitaxial region having an upper surface, a first well of a first conductivity type in the epitaxial region, and a second well of a second conductivity type in the epitaxial region. The second conductivity type is of an opposite conductivity type to the first conductivity type. The second well is above and in direct contact with the first well. The second well includes a central section having a bottom with a first depth relative to the upper surface of the epitaxial region, and a first concentric section laterally surrounding the central section, the first concentric section having a bottom with a second depth relative to the upper surface of the epitaxial region, in which the second depth is different from the first depth.

In another aspect of the present disclosure, there is provided a photodiode including an epitaxial region having an upper surface, a first well of a first conductivity type in the epitaxial region, a second well of a second conductivity type in the epitaxial region, a guard region of the second conductivity type in the epitaxial region, the guard region laterally surrounds the second well and has a different dopant concentration from the second well, and a third well of the first conductivity type in the epitaxial region, the third well is concentric to the second well. The second conductivity type is of an opposite conductivity type to the first conductivity type. The second well is above and in direct contact with the first well. The second well includes a central section having a bottom with a first depth relative to the upper surface of the epitaxial region, a first concentric section laterally surrounding the central section, the first concentric section having a bottom with a second depth relative to the upper surface of the epitaxial region, in which the second depth is different from the first depth, and a second concentric section laterally surrounding the first concentric section, the second concentric section having a bottom with a third depth relative to the upper surface of the epitaxial region, in which the second depth is different from the third depth.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1A:
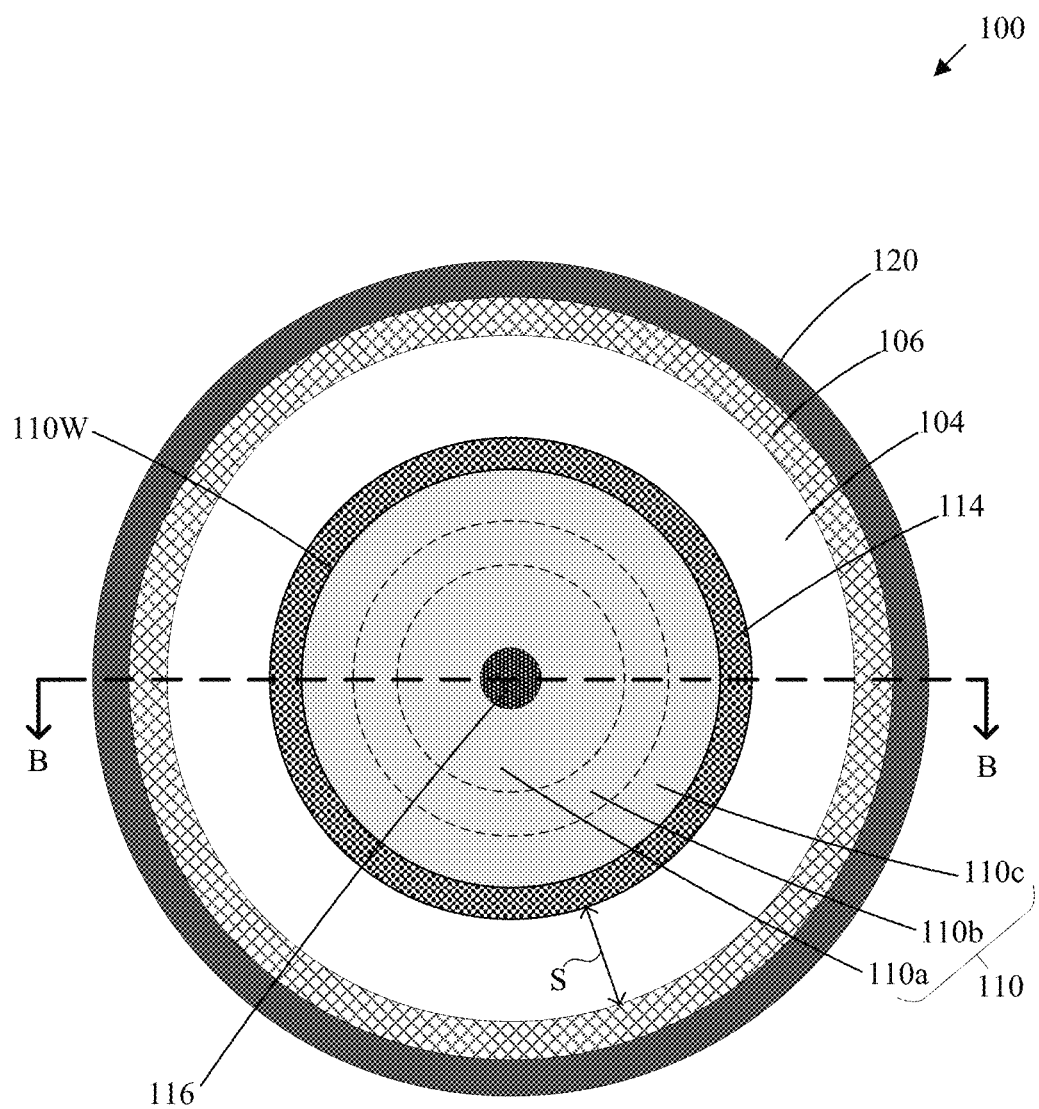
FIG. 1A is a top-down view depicting an example of a photodiode.
Figure 1B:
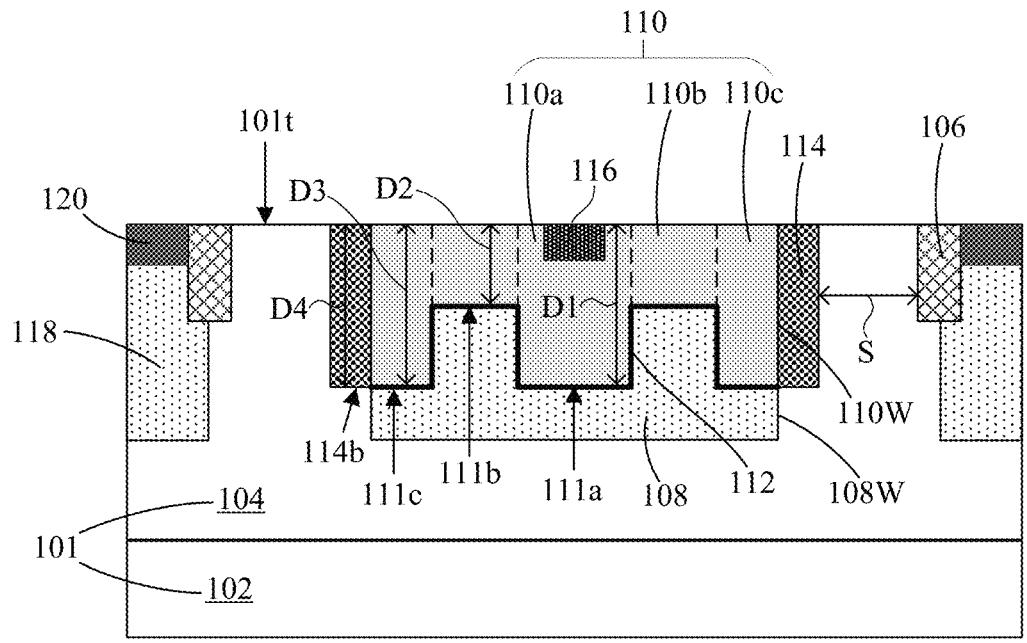
FIG. 1B is a cross-sectional view of the photodiode shown in FIG. 1A.
Figure 1C:
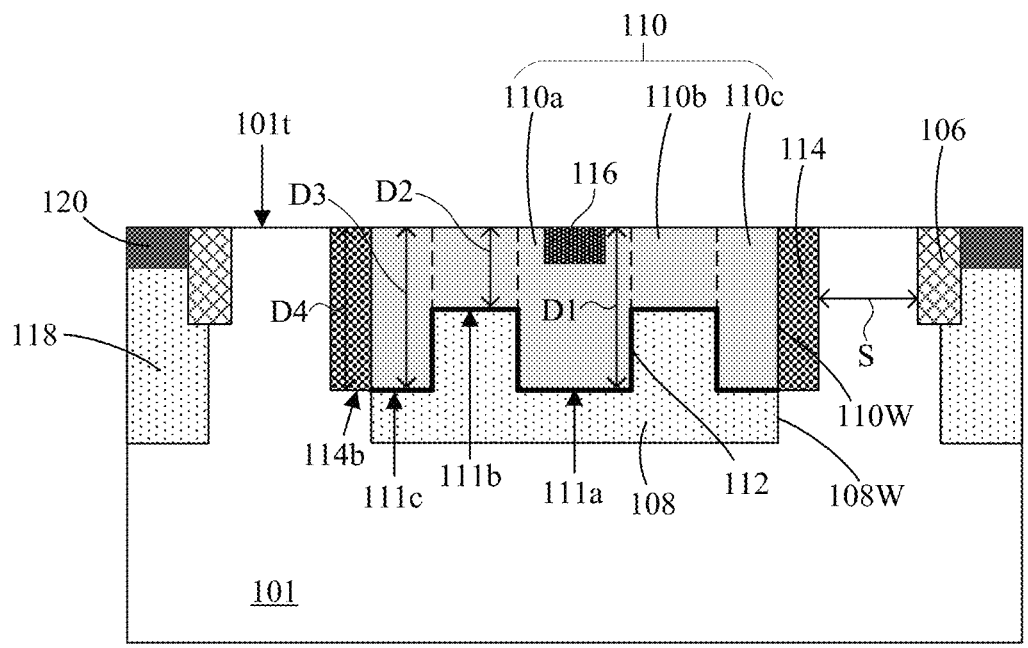
FIG. 1C is an alternative cross-sectional view of the photodiode shown in FIG. 1A.

FIG. 1A shows a top-down view of an example photodiode 100. FIG. 1B shows an example cross-sectional view of the photodiode 100 in FIG. 1A. FIG. 1C shows another example cross-sectional view of the photodiode 100 in FIG. 1A. Line BB in FIG. 1A indicates the cross-section from which the views in FIG. 1B and FIG. 1C are taken from. Referring to FIG. 1A, FIG. 1B, and FIG. 1C, the exemplary photodiode 100 may include a substrate 101, a first well 108 in the substrate 101, and a second well 110 in the substrate 101. The substrate 101 may include various doped regions or doped wells. The substrate 101 may have an upper surface 101t. The upper surface 101t of the substrate 101 may be used as a reference point to determine the depths of various doped regions or doped wells in the substrate 101.

In the embodiment shown in FIG. 1B, the substrate 101 may include an epitaxial layer 104 formed on a base semiconductor 102. The epitaxial region 104 and the base semiconductor 102 may include a semiconductor material, such as silicon, germanium, silicon germanium (SiGe), silicon carbide, and those consisting essentially of III-V compound semiconductors, such as GaAs, II-VI compound semiconductors such as ZnSe. The epitaxial region 104 and the base semiconductor 102 may have an amorphous, polycrystalline, or monocrystalline structure. The base semiconductor 102 may have a different crystalline structure from the epitaxial region 104. Alternatively, in the embodiment shown in FIG. 1C, the substrate 101 may be a bulk semiconductor substrate. The bulk semiconductor substrate 101 may have an amorphous, polycrystalline, or monocrystalline structure. The bulk semiconductor substrate 101 may include a semiconductor material, such as silicon, germanium, silicon germanium (SiGe), silicon carbide, and those consisting essentially of III-V compound semiconductors, such as GaAs, II-VI compound semiconductors such as ZnSe.

The first well 108 may be of a first conductivity type (e.g., P-type or N-type). The second well 110 may be a second conductivity type (e.g., P-type or N-type), in which the second conductivity type is of an opposite conductivity type to the first conductivity type. For example, the second well 110 may be of an N-type conductivity while the first well 108 may be a P-type conductivity. Alternatively, the second well 110 may be of a P-type conductivity while the first well 108 may be an N-type conductivity. The substrate 101 may be lightly doped and may be of the first conductivity type (i.e., the same conductivity type as the first well 108). Alternatively, the substrate 101 may be intrinsically doped. As used herein, the term "intrinsic doping" or "intrinsically doped" may refer to a region that is substantially free of moderate levels of extrinsic doping atoms but may still contain charge carriers provided by other doped portions of the structure. For example, the substrate 101 may include charge carriers provided by the first well 108.

The second well 110 may be above the first well 108 and in direct contact with the first well 108. The second well 110 may directly contact the first well 108 to form an electrical junction 112 between the second well 110 and the first well 108. The electrical junction 112 may be a P-N junction. Photoabsorption and carrier generation may occur in the electrical junction 112. The electrical junction 112 may be configured to provide a zone for the multiplication of charge carriers (e.g., electrons and holes). The electrical junction 112 may also be configured to absorb an incident photon. As an illustrative example, electromagnetic waves (i.e., photons) may be incident on the electrical junction 112. The electrical junction 112 may be reverse-biased at a voltage above the breakdown voltage of the photodiode 100, which creates a high electric field across the electrical junction 112. The incident photon may be absorbed in the electrical junction 112 and trigger the generation of an excited charge carrier. The high electric field can cause a photo-generated charge carrier to enter the multiplication region to induce and multiply additional charge carriers by impact ionization. The multiplication of charge carriers in the multiplication region triggers an avalanche breakdown, which creates a current (i.e., a pulse or an electrical signal) that can be detected. The avalanche breakdown may be subsequently quenched to stop the multiplication of charge carriers.

The second well 110 may include concentric sections configured concentrically to a central section. For example, the second well 110 may include a central section 110*a*, a first concentric section 110*b* laterally surrounding the central section 110*a*, and a second concentric section 110*c* laterally surrounding the first concentric section 110*b*. The first concentric section 110*b* and the second concentric section 110*c* may be concentric or coaxial to the central section 110*a*. The central section 110*a* may have a bottom 111*a* with a first depth D1 relative to the upper surface 101*t* of the substrate 101. The first concentric section 110*b* may have a bottom 111*b* with a second depth D2 relative to the upper surface 101*t* of the substrate 101, in which the second depth D2 is different from the first depth D1. The second concentric section 110*c* may have a bottom 111*c* with a third depth D3 relative to the upper surface 101*t* of the substrate 101, in which the third depth D3 may be the same as the first depth D1, and the second depth D2 may be different from the third depth D3. The respective bottoms 111*a*, 111*b*, 111*c* of the sections 110*a*, 110*b*, 110*c* in the second well 110 may directly contact the first well 108 such that the electrical junction 112 between the first well 108 and the second well 110 may have a serpentine shape. In some embodiments, as illustrated in FIG. 1B and FIG. 1C, the second depth D2 may be less than the first depth D1 and less than the third depth D3. Alternatively, in other embodiments (not shown), the second depth D2 may be larger than the first depth D1 and larger than the third depth D3.

Advantageously, by configuring the first concentric section 110*b* to be laterally between the central section 110*a* and the second concentric section 110*c*, and configuring the first concentric section 110*b* to have a depth D2 that is different from the depth D1 of the central section 110*a* and the depth D3 of the second concentric section 110*c*, the area of contact between the first well 108 and the second well 110 can be increased. Hence, the electrical junction 112 between the first well 108 and the second well 110 can become larger, and the breakdown voltage of the photodiode 100 can be reduced. Accordingly, the bias voltage and the power consumption for the operation of the photodiode 100 can be reduced. Additionally, with a larger electrical junction 112, the photon detection probability can be increased for the same power input, thereby increasing the sensitivity and efficiency of the photodiode 100.

The second well 110 may have a perimeter 110W. The first well 108 may have a perimeter 108W. The perimeter 110W of the second well 110 may be the same as the perimeter 108W of the first well 108. The electrical junction 112 between the first well 108 and the second well 110 may be surrounded by (i.e., enclosed within) the perimeter 110W of the second well 110. By having the electrical junction 112 surrounded by the perimeter 110W of the second well 110, the electrical junction 112 can be increased without increasing the pixel size and the fill factor of the photodiode 100.

The first well 108 may have a dopant concentration in the range of about 1E16 atoms/cm$^3$ to about 1E18 atoms/cm$^3$. The second well 110 may have a dopant concentration in the range of about 1E16 atoms/cm$^3$ to about 1E18 atoms/cm$^3$. In some embodiments, the first concentric section 110*b* in the second well 110 may have a different dopant concentration from the second concentric section 110*c* in the second well 110 and the central section 110*a* in the second well 110. For example, the first concentric section 110*b* may have either a lower or a higher dopant concentration than the second concentric section 110*c* and the central section 110*a*. The second concentric section 110*c* in the second well 110 and the central section 110*a* in the second well 110 may have the same dopant concentrations. In other embodiments, the first concentric section 110b in the second well 110, the second concentric section 110c in the second well 110, and the central section 110a in the second well 110 have the same dopant concentrations.

The photodiode 100 may include a guard region 114 of the second conductivity type in the substrate 101. The guard region 114 may laterally surround the second well 110. The guard region 114 may be concentric to the second well 110 and may be in direct contact with the second well 110. In an embodiment, the guard region 114 may be in direct contact with the second concentric section 110c of the second well 110. The guard region 114 may have a bottom 114b with a fourth depth D4 relative to the upper surface 101t of the substrate 101, in which the fourth depth D4 may be the same as the first depth D1. In an embodiment, the depth D4 of the guard region 114 may be the same as the depth D3 of the second concentric section 110c of the second well 110 and the depth D1 of the central section of the second well 110. The guard region 114 may have a different dopant concentration from the second well 110. For example, the guard region 114 may have a lower dopant concentration than the second well 110. The guard region 114 may have a dopant concentration in the range of about 1E13 atoms/cm$^3$ to about 1E18 atoms/cm$^3$.

The guard region 114 may laterally surround the electrical junction 112 between the first well 108. In an embodiment, the guard region 114 may confine the electrical junction 112 to be between the first well 108 and the second well 110 and may prevent the formation of any electrical junctions between side edges of the second well 110 and the substrate 101. The guard region 114 may serve to focus the electric field on the multiplication zone in the electrical junction 112. Thus, the impact ionization of charge carriers can be confined between the second well 110 and the first well 108. The confinement of the electrical junction 112 by the guard region 114 may also improve various performance parameters of the photodiode 100, such as preventing premature edge breakdown and failure of the photodiode 100, increasing the quantum efficiency, increasing the probability of triggering the avalanche breakdown, and reducing the timing jitter.

The photodiode 100 may also include an isolation structure 106 in the substrate 101. The isolation structure 106 may laterally surround the guard region 114. The isolation structure 106 may be concentric to the second well 110. The isolation structure 106 may be spaced apart from the guard region 114 by a spacing S. The spacing S may be in the range between about 0 µm to about 2 µm or between about 0.05 µm to about 0.5 µm. In some embodiments, the isolation structure 106 may be a shallow isolation structure. The isolation structure 106 may include an oxide (e.g., silicon dioxide) or a nitride (e.g., silicon nitride). Advantageously, by having the guard region 114 be spaced apart from the isolation structure 106, it is found that the dark counts detected by the device (i.e., dark current) can be reduced, which can be beneficial for detecting low-level signals. For example, the likelihood of charge carriers forming at the periphery of the isolation structure 106 can be reduced, thereby preventing after-pulsing effects that may cause dark counts.

The photodiode 100 may further include a third well 118 of the first conductivity type in the substrate 101. For example, the third well 118 may be of the same conductivity type as the first well 108 and the substrate 101. The third well 118 may laterally surround the isolation structure 106. The third well 118 may be concentric to the second well 110. The third well 118 may have a larger dopant concentration than the substrate 101. The third well 118 may have a dopant concentration in the range of about 1E15 atoms/cm$^3$ to about 1E18 atoms/cm$^3$. In some embodiments, the third well 118 may have the same depth as the first well 108.

A first contact region 116 may be formed in the second well 110 and may be of the second conductivity type. For example, the first contact region 116 may be formed in the central section 110a of the second well 110. The first contact region 116 may have a higher dopant concentration than the central section 110a of the second well 110. The first contact region 116 may have a dopant concentration in the range of about 1E18 atoms/cm$^3$ to about 1E20 atoms/cm$^3$. A second contact region 120 may be formed in the third well 118 and may be of the first conductivity type. The second contact region 120 may have a higher dopant concentration than the third well 118. The second contact region 120 may have a dopant concentration in the range of about 1E18 atoms/cm$^3$ to about 1E20 atoms/cm$^3$. The first contact region 116 and the second contact region 120 may provide electrical connection points with other circuitry components in the device. For example, electrodes such as an anode electrode or a cathode electrode (not shown) may be formed on the first contact region 116 and the second contact region 120, respectively, or vice versa.

Figure 2A:
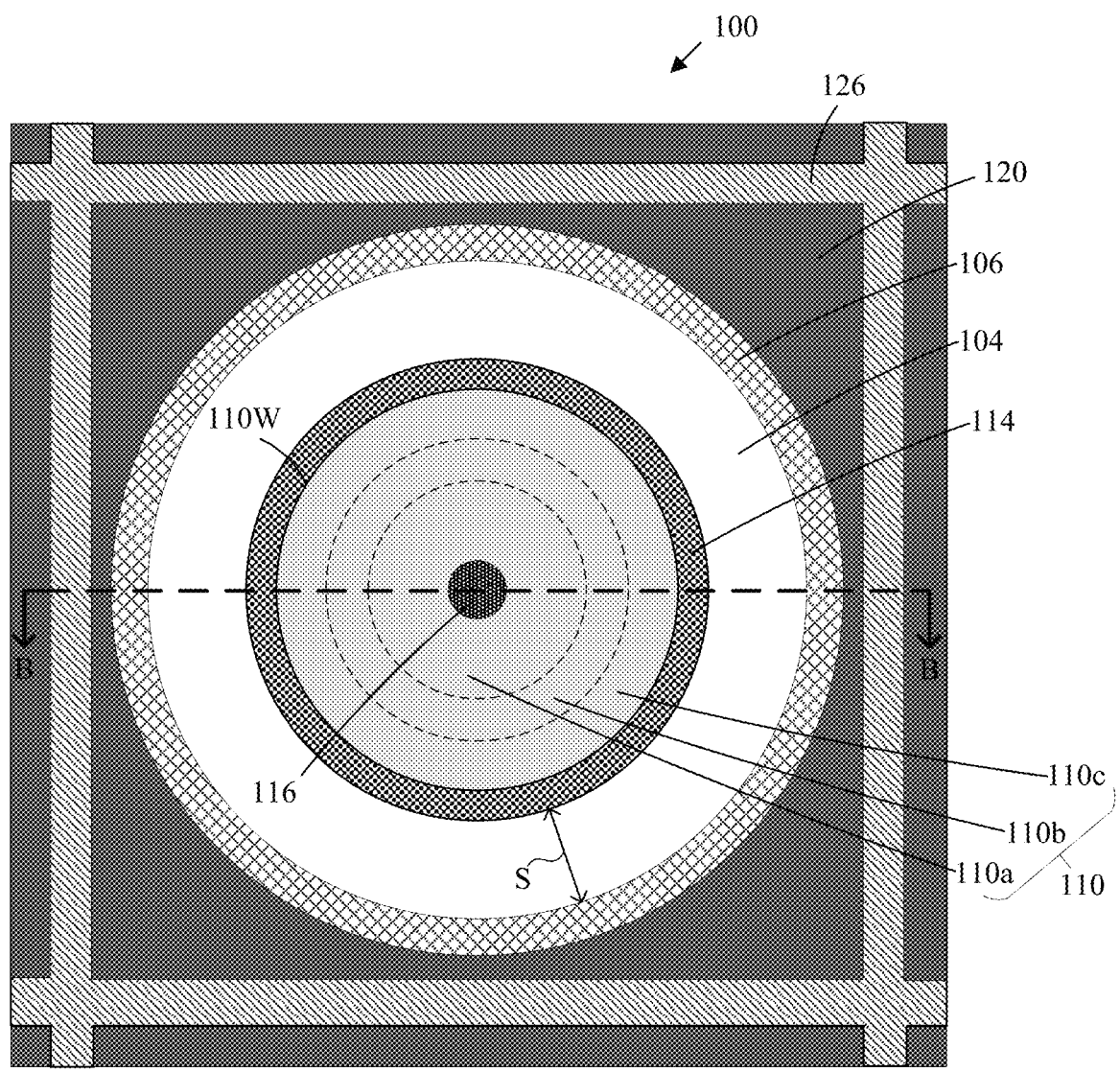
FIG. 2A is a top-down view depicting another example of a photodiode.
Figure 2B:
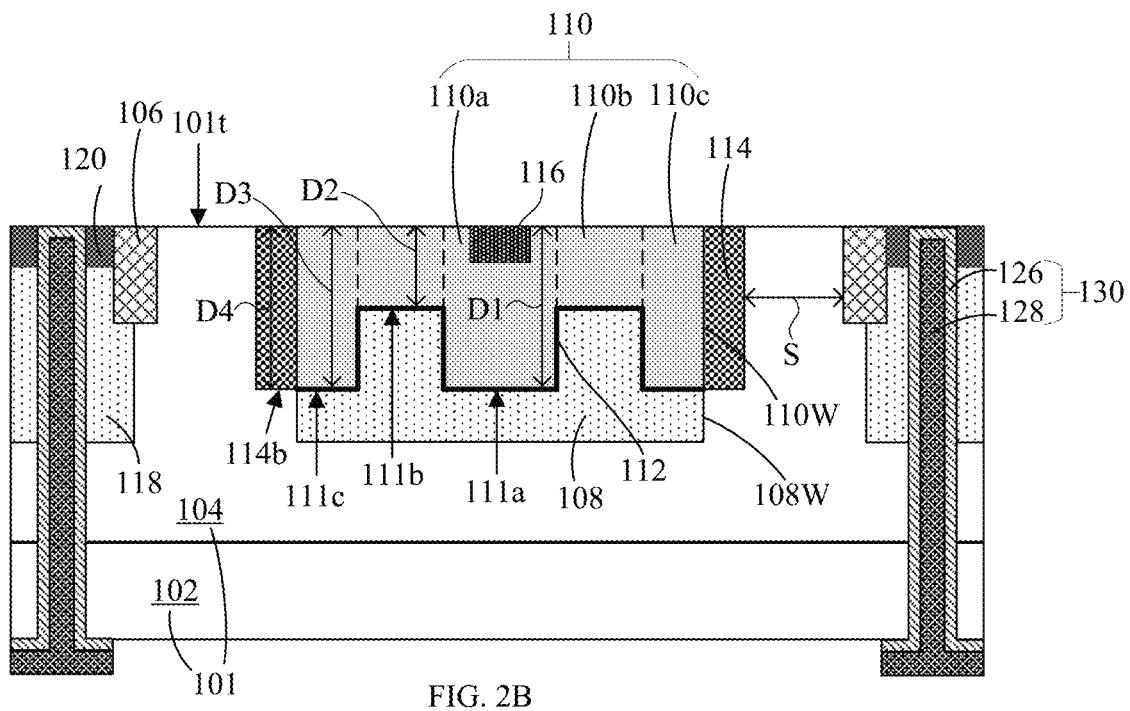
FIG. 2B is a cross-sectional view of the photodiode shown in FIG. 2A.
Figure 2C:
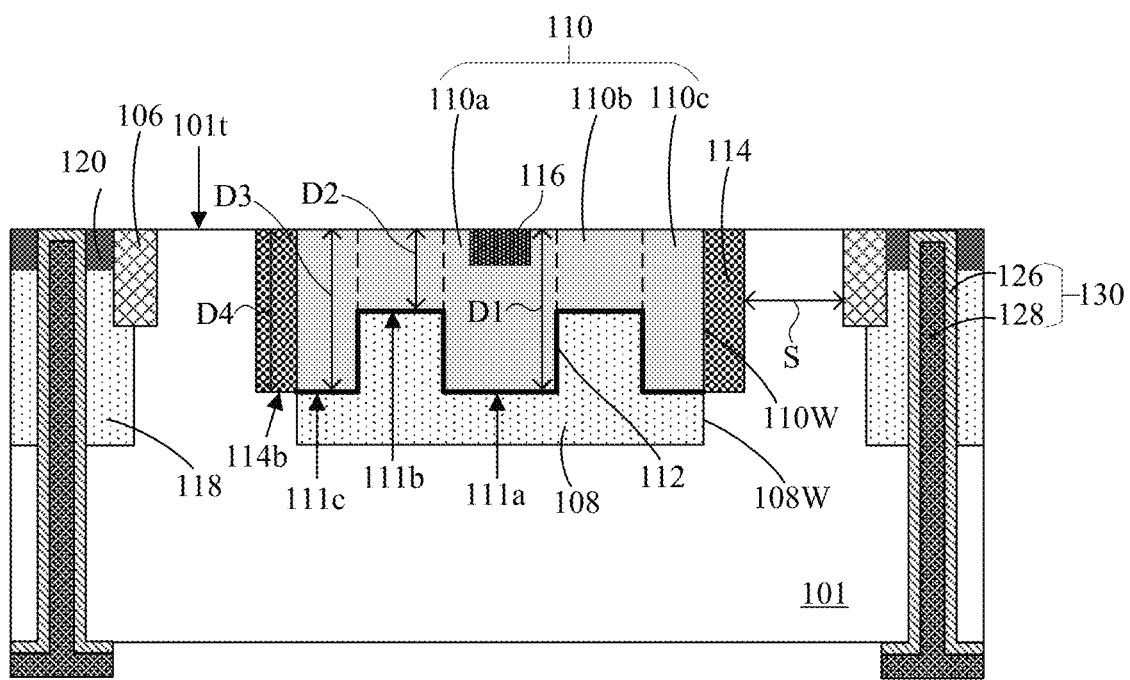
FIG. 2C is an alternative cross-sectional view of the photodiode shown in FIG. 2A.

FIG. 2A shows a top-down view of another example photodiode 100. FIG. 2B shows an example cross-sectional view of the photodiode 100 in FIG. 2A. FIG. 2C shows another example cross-sectional view of the photodiode 100 in FIG. 2A. Line BB in FIG. 2A indicates the cross-section from which the views in FIG. 2B and FIG. 2C are taken from. Referring to FIG. 2A, FIG. 2B, and FIG. 2C, in which like reference numerals in FIGS. 2A, 2B, 2C refer to like features in FIGS. 1A, 1B, 1C respectively, the exemplary photodiode 100 may include a shallow isolation structure 106 in the substrate 101 and a deep isolation structure 130 in the substrate 101. The deep isolation structure 130 may laterally surround and be concentric to the third well 118. The deep isolation structure 130 may have a larger depth than the shallow isolation structure 106. For example, the deep isolation structure 130 may extend deeper into the substrate 101 as compared to the shallow isolation structure 106. The shallow isolation structure 106 may include an oxide (e.g., silicon dioxide) or a nitride (e.g., silicon nitride). The deep isolation structure 130 may include a semiconductor core 128 (e.g., polysilicon) surrounded by a dielectric liner 126. The dielectric liner 126 may include an oxide or a nitride. Examples of oxides for the dielectric liner 126 may include, but are not limited to, silicon dioxide, silicon oxynitride, tetraethyl orthosilicate (TEOS), or silicon-rich silicon oxide. Examples of nitrides for the dielectric liner 126 may include, but are not limited to, silicon nitride, or silicon oxynitride. The deep isolation structure 130 may provide additional electrical isolation of the photodiode 100 from other nearby semiconductor devices or photodiodes formed on the substrate 101, which can improve its performance in a densely-packed or pixelated array of photodiodes, for example.

As shown in FIG. 1A, the first contact region 116, the second well 110, the guard region 114, the isolation structure 106, and the second contact region 120 may have circular, elliptical, or oval shapes. Alternatively, in other embodiments (not shown), the first contact region 116, the second well 110, the guard region 114, the isolation structure 106, and the second contact region 120 may have other shapes, such as polygonal shapes (e.g., square, rectangle, pentagonal, octagonal, hexagonal, etc.).

As shown in FIG. 2A, the first contact region 116, the second well 110, the guard region 114, the shallow isolation structure 106 may have circular, elliptical, or oval shapes. The second contact region 120 and the deep isolation structure 130 may have square or rectangle shapes. Alternatively, in other embodiments (not shown), the first contact region 116, the second well 110, the guard region 114, the shallow isolation structure 106, the second contact region 120, and the deep isolation structure 130 may be modified to have other shapes, such as polygonal shapes (e.g., square, rectangle, pentagonal, octagonal, hexagonal, etc.), circular, elliptical, or oval shapes.

FIGS. 3 through 8 show a set of steps that may be used to create the photodiodes described herein.

As used herein, "deposition techniques" refer to the process of applying a material over another material (or the substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" include deposition of material or photoresist, patterning, exposure, development, etching, cleaning, and/or removal of the material or photoresist as required in forming a described pattern, structure, or opening. Examples of techniques for patterning include, but are not limited to, wet etch lithographic processes, dry etch lithographic processes, or direct patterning processes. Such techniques may use mask sets and mask layers.

The term "epitaxial growth" as used herein refers to the growth of a semiconductor material on a deposition surface of a same or different semiconductor material, in which the grown semiconductor material will have the same crystalline characteristics as the deposition surface of the semiconductor material.

Figure 3:
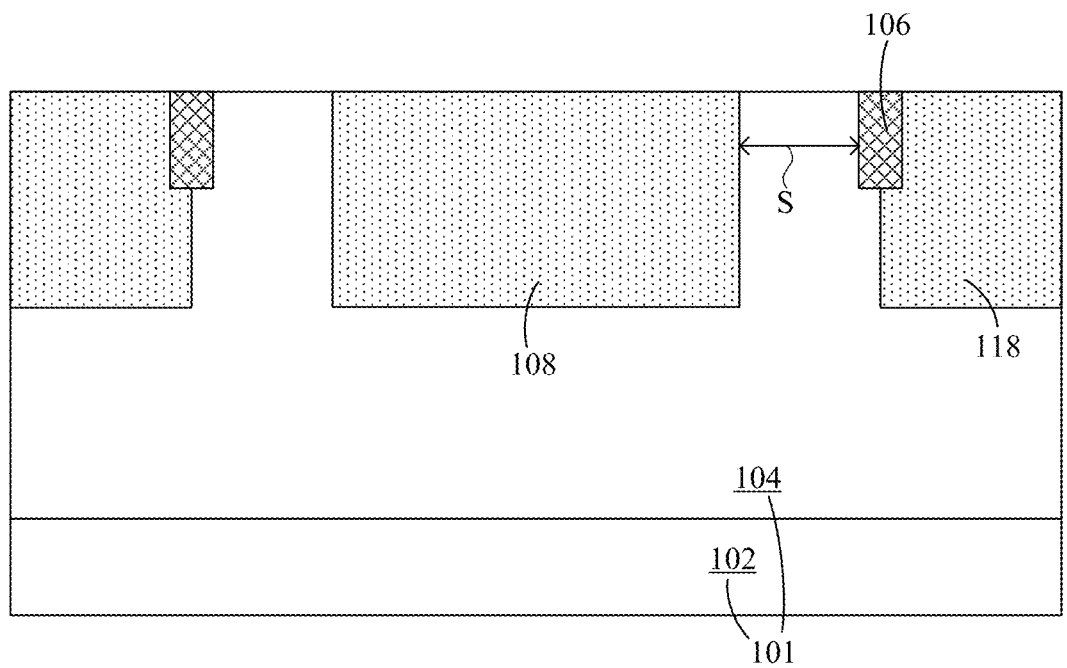
FIG. 3 through FIG. 8 are cross-sectional views depicting structures at various stages of a process of fabricating the exemplary photodiodes described herein.

Referring to FIG. 3, a structure for the fabrication of a photodiode may include a substrate 101. In some embodiments, the substrate 101 may include an epitaxial region 104 formed on a semiconductor base 102. The epitaxial region 104 may be formed using epitaxial growth of a semiconductor material with in-situ doping thereof. The epitaxial region 104 and the semiconductor base 102 may be lightly doped with a dopants having either an N-type conductivity or a P-type conductivity. The dopants may be of an N-type conductivity or a P-type conductivity. Exemplary dopants for N-type conductivity doping may include, but are not limited to, arsenic, phosphorus, or antimony. Exemplary dopants for P-type conductivity doping may include, but are not limited to, boron, aluminum, or gallium.

An isolation structure 106 may be formed in the substrate 101 (e.g., formed in the epitaxial region 104). The isolation structure 106 may be formed by patterning the substrate 101 to define an opening (not shown) in the substrate 101, followed by depositing an oxide or a nitride in the opening. A first well 108 and a third well 118 may be formed in the substrate 101. Formation of the wells 108, 118 may include the use of an ion implantation process to introduce dopants into the substrate 101. An implant mask may be used in the ion implantation process. The first well 108 may be formed to be laterally surrounded by the isolation structure 106. The first well 108 may be formed to be spaced apart from the isolation structure 106 by a spacing S. The third well 108 may laterally surround the isolation structure 106. The first well 108 and the third well 118 may be doped with dopants of a first conductivity type. The third well 118 and the isolation structure 106 may be concentric to the first well 108. In some embodiments, the first well 108 and the third well 118 may be formed to have the same depth.

Figure 4:
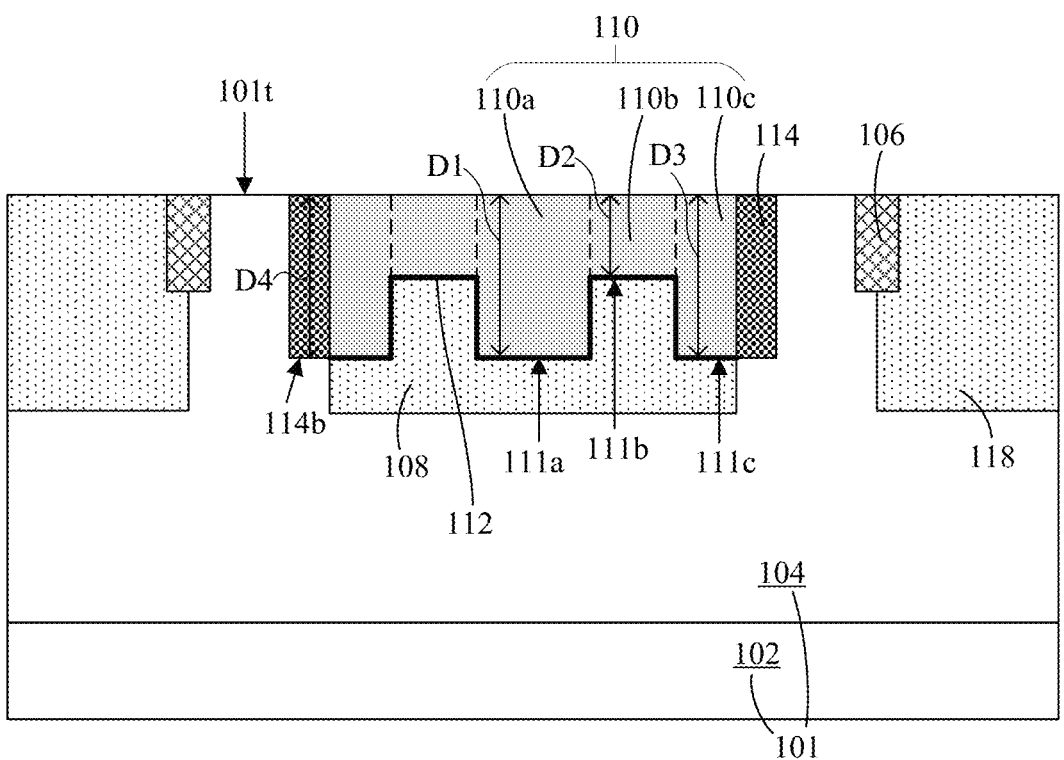

Referring to FIG. 4, a second well 110 may be formed above and in direct contact with the first well 108. The second well 110 may be formed by doping the first well 108 using an ion implantation process with the use of an implant mask. The second well 110 may be of a second conductivity type. In other words, the second well 110 may have an opposite conductivity to the first well 108 and the third well 118. For example, the first well 108 and the third well 118 may have P-type conductivities. To form the second well 110, dopants of an N-type conductivity may be introduced into the first well 108. The concentration of the N-type dopants used in the ion implantation process may be greater than the concentration of the P-type dopants in the first well 108 so that the resulting second well 110 formed above the first well 108 has an N-type conductivity.

As described herein, the second well 110 may be formed to have a central section 110a, a first concentric section 110b laterally surrounding the central section 110a, and a second concentric section 110c laterally surrounding the first concentric section 110b. The first concentric section 110b and the second concentric section 110c may be concentric or coaxial to the central section 110a. The second well 110 may be formed by performing at least two doping steps in the ion implantation process using different implant masks. For example, a first doping step may be performed to form the central section 110a and the second concentric section 110c. The central section 110a may have a bottom 111a with a first depth D1 relative to the upper surface 101t of the substrate 101. The second concentric section 110c may have a bottom 111c with a third depth D3 relative to the upper surface 101t of the substrate 101, in which the third depth D3 may be the same as the first depth D1 and the second depth D2 may be different from the third depth D3 (e.g., the second depth D2 may be either less than or larger than the third depth D3). A second doping step may be performed to form the first concentric section 110b. The first concentric section 110b may have a bottom 111b with a second depth D2 relative to the upper surface 101t of the substrate 101. The second doping step to form the first concentric section 110b may be controlled such that the second depth D2 is different from the first depth D1 (e.g., the second depth D2 may be either less than or larger than the first depth D1). The first and second doping steps may use dopants of the same conductivity type. In some embodiments, the second doping step may introduce dopants of either a lower or a higher concentration than those used in the first doping step such that the first concentric section 110b has either a lower or a higher dopant concentration than the central section 110a and the second concentric section 110c. In other embodiments, the second doping step may preferably introduce dopants of the same concentration as those used in the first doping step.

A guard region 114 may be formed in the substrate 101. The guard region 114 may be formed by doping the substrate 101 using an ion implantation process with the use of an implant mask. For example, the guard region 114 may be formed by doping the substrate 101 with dopants of the second conductivity type. An implant mask may be used in the ion implantation process. The guard region 114 may have a bottom 114b with a fourth depth D4 relative to the upper surface 101t of the substrate 101. The ion implantation process to form the guard region 114 may be controlled such that the depth D4 of the guard region 114 is the same as the depth of the central section 110a and the second concentric section 110c of the second well 110.

Figure 5:
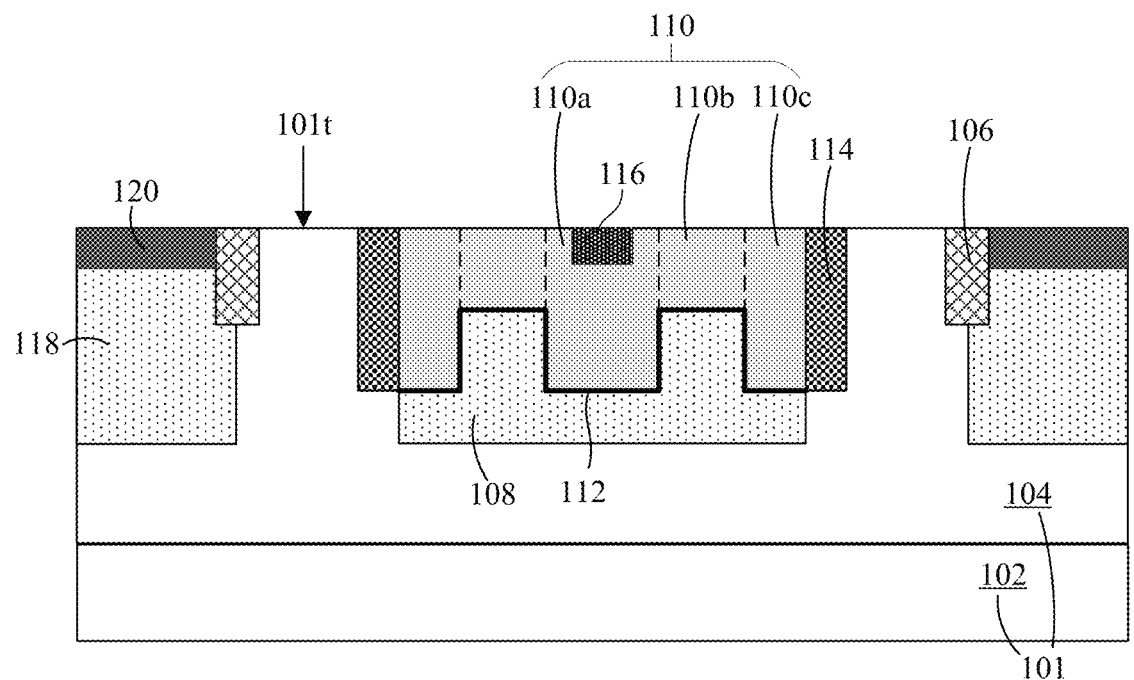

Referring to FIG. 5, a first contact region 116 may be formed in the second well 110 using an ion implantation process with the use of an implant mask. For example, a dopant of the second conductivity may be introduced into the central section 110a of the second well 110. The first contact region 116 may be formed with at a higher concentration than that of the second well 110. A second contact region 120 may be formed in the third well 118 using an ion implantation process with the use of an implant mask. For example, a dopant of the first conductivity may be introduced into the third well 118, in which the second contact region 120 may be formed with at a higher concentration than that of the third well 118. Formation of the first contact region 116 and the second contact region 120 may use different ion implantation processes and implant masks.

Figure 6:
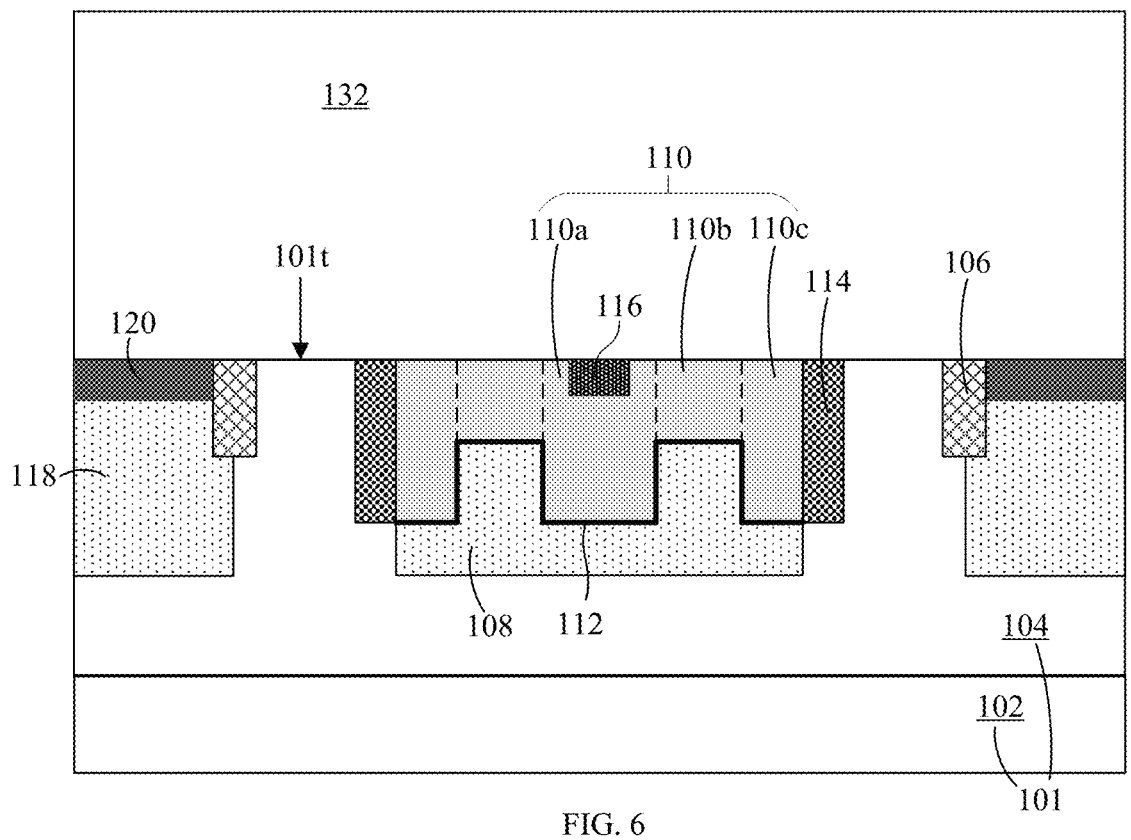

Referring to FIG. 6, a back end of line (BEOL) region 132 may be formed over the substrate 101. The BEOL region 132 may include several layers of interlayer dielectric stacked in a vertical arrangement. Examples of the material in the interlayer dielectric may include, but are not limited to, silicon dioxide, tetraethyl orthosilicate (TEOS), or a material having a chemical composition of $SiC_xO_yH_z$, wherein x, y, and z are in stoichiometric ratio. The BEOL region 132 may also include interconnect features (e.g., interconnect vias, contact structures, conductive lines) formed in the layers of interlayer dielectric. These interconnect features may provide interconnections between the photodiode and other circuit components in an IC chip. Formation of the BEOL region 132 may include the use of several deposition techniques and patterning techniques.

Figure 7:
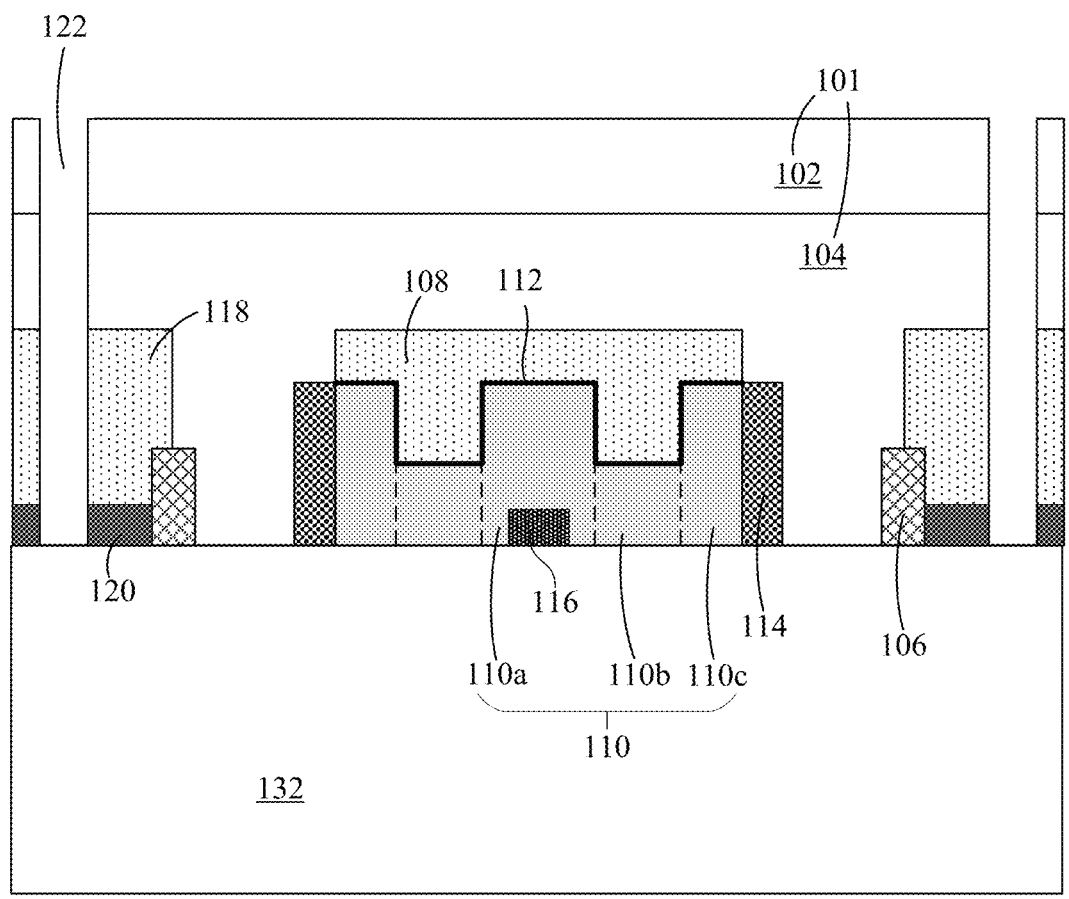
Figure 8:
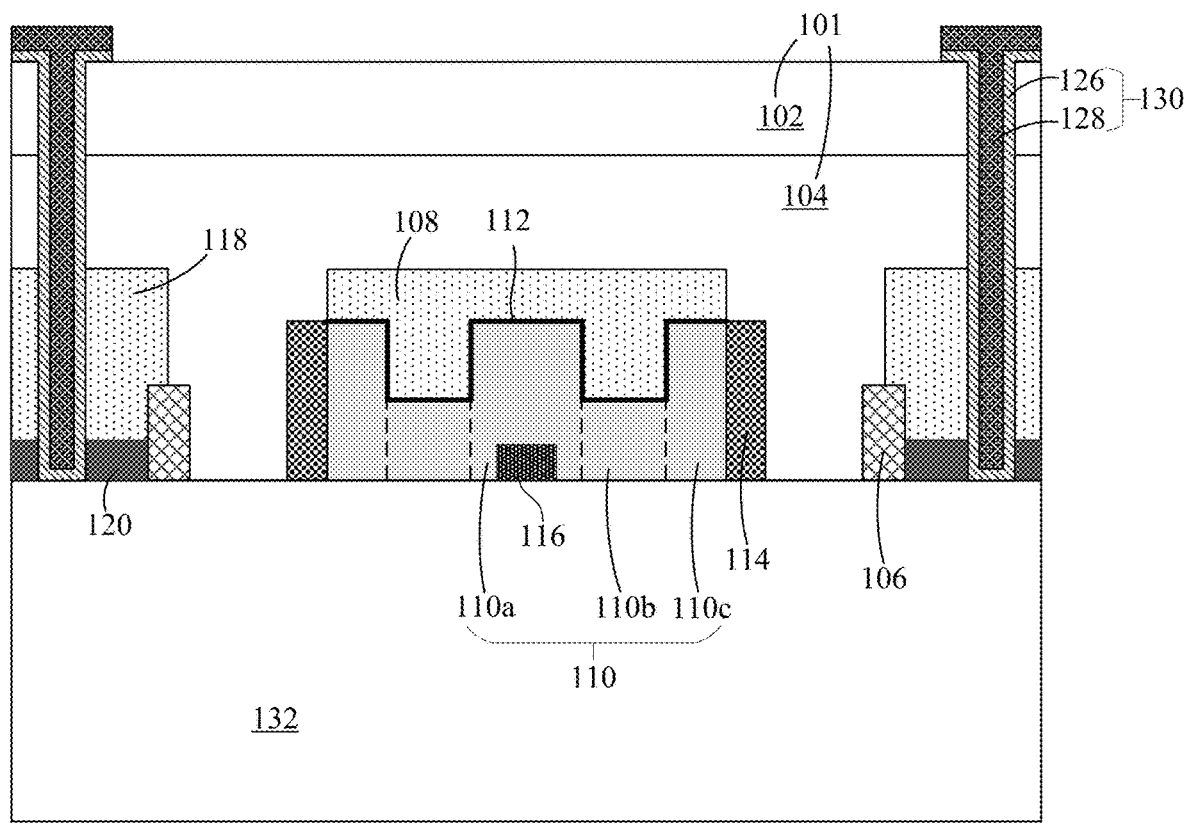

Referring to FIG. 7 and FIG. 8, an isolation structure 130 may be formed in the substrate 101. The isolation structure 130 may have a larger depth as compared to the isolation structure 106. As shown in FIG. 7, the substrate 101 may be patterned to form an opening 122. The formation of the opening 122 may include flipping or turning the substrate 101 (e.g., by 180 degrees) such that the substrate 101 is oriented to face up while the first well 108 and the BEOL region 132 face down. In other words, the substrate 101 may be oriented above the BEOL region 132. The opening 122 may be formed above the BEOL region 132. In embodiments where the substrate 101 includes the epitaxial region 104 and the semiconductor base 102, the opening 122 may extend vertically through the semiconductor base 102 and the epitaxial region 104. As shown in FIG. 8, a dielectric liner 126 may be deposited in the opening 122, followed by the deposition of a semiconductor core 128, in which the semiconductor core 128 is surrounded by the dielectric liner 126. The isolation structure 130 may be formed above the BEOL region 132. For simplicity, the illustration of the BEOL region 132 is omitted from the top-down views in FIG. 1A and FIG. 2A.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the semiconductor devices and methods disclosed herein may be employed in manufacturing a variety of different integrated circuit products and modules, including, but not limited to, CMOS devices, image sensors, optoelectronic modules, LIDAR instrumentation, and LIDAR systems, etc.

What is claimed is:

1. A photodiode comprising:
   a substrate having an upper surface;
   a first well of a first conductivity type in the substrate; and
   a second well of a second conductivity type in the substrate, the second conductivity type is of an opposite conductivity type to the first conductivity type, the second well is above and in direct contact with the first well, the second well comprises:
      a central section having a bottom with a first depth relative to the upper surface of the substrate;
      a first concentric section laterally surrounding the central section, the first concentric section having a bottom with a second depth relative to the upper surface of the substrate, wherein the second depth is different from the first depth, and wherein the first concentric section in the second well has a different dopant concentration from the central section in the second well; and
      a second concentric section laterally surrounding the first concentric section, the second concentric section has a bottom with a third depth relative to the upper surface of the substrate, wherein the second depth is different from the third depth.

2. The photodiode of claim 1, wherein the second well directly contacts the first well to form an electrical junction between the second well and the first well.

3. The photodiode of claim 2, wherein the second depth is less than the first depth or the second depth is larger than the first depth.

4. The photodiode of claim 1, wherein the first concentric section in the second well has a different dopant concentration from the second concentric section in the second well.

5. The photodiode of claim 4, wherein the second concentric section in the second well and the central section in the second well have the same dopant concentrations.

6. The photodiode of claim 2, wherein the second well has a perimeter, the first well has a perimeter, and the perimeter of the second well is the same as the perimeter of the first well.

7. The photodiode of claim 2, further comprising a guard region of the second conductivity type in the substrate, the guard region laterally surrounds the electrical junction between the first well and the second well.

8. The photodiode of claim 7, wherein the guard region is in direct contact with and concentric to the second concentric section in the second well.

9. The photodiode of claim 8, wherein the guard region has a bottom with a depth relative to the upper surface of the substrate, the depth of the guard region is the same as the third depth.

10. The photodiode of claim 7, further comprising an isolation structure in the substrate, the isolation structure is spaced apart from and laterally surrounds the guard region.

11. The photodiode of claim 10, wherein the isolation structure is concentric to the second well.

12. The photodiode of claim 11, further comprising a third well of the first conductivity type in the substrate, the third well laterally surrounds the isolation structure.

13. The photodiode of claim 12, wherein the third well is in direct contact with and concentric to the isolation structure.

14. The photodiode of claim 7, further comprising:
a shallow isolation structure in the substrate, the shallow isolation structure is spaced apart from and laterally surrounds the guard region;
a third well of the first conductivity type in the substrate, the third well laterally surrounds the shallow isolation structure; and
a deep isolation structure in the substrate, the deep isolation structure laterally surrounds the third well, the deep isolation structure has a larger depth than the shallow isolation structure.

15. The photodiode of claim 1, wherein the bottom of the first concentric section directly contacts the first well.

16. A photodiode comprising:
a substrate having an upper surface;
a first well of a first conductivity type in the substrate;
a second well of a second conductivity type in the substrate, the second conductivity type is of an opposite conductivity type to the first conductivity type, the second well is above and in direct contact with the first well, the second well comprises:
a central section having a bottom with a first depth relative to the upper surface of the substrate;
a first concentric section laterally surrounding the central section, the first concentric section having a bottom with a second depth relative to the upper surface of the substrate, wherein the second depth is different from the first depth; and
a second concentric section laterally surrounding the first concentric section, the second concentric section having a bottom with a third depth relative to the upper surface of the substrate, wherein the second depth is different from the third depth, and wherein the first concentric section in the second well has a different dopant concentration from the second concentric section in the second well and the central section in the second well;
a guard region of the second conductivity type in the substrate, the guard region laterally surrounds the second well and has a different dopant concentration from the second well; and
a third well of the first conductivity type in the substrate, the third well is concentric to the second well.

17. The photodiode of claim 16, further comprising:
a first contact region of the second conductivity type in the central section of the second well, the first contact region having a higher dopant concentration than the central section of the second well; and
a second contact region of the first conductivity type in the third well, the second contact region having a higher dopant concentration than the third well.

18. The photodiode of claim 17, further comprising a shallow isolation structure in the substrate, the shallow isolation structure is spaced apart from and laterally surrounds the guard region.

19. A photodiode comprising:
a substrate having an upper surface;
a first well of a first conductivity type in the substrate;
a second well of a second conductivity type in the substrate, the second conductivity type is of an opposite conductivity type to the first conductivity type, the second well is above and in direct contact with the first well, the second well comprises:
a central section having a bottom with a first depth relative to the upper surface of the substrate;
a first concentric section laterally surrounding the central section, the first concentric section having a bottom with a second depth relative to the upper surface of the substrate, wherein the second depth is different from the first depth; and
a second concentric section laterally surrounding the first concentric section, the second concentric section has a bottom with a third depth relative to the upper surface of the substrate, wherein the second depth is different from the third depth; and
a guard region of the second conductivity type in the substrate, the guard region laterally surrounds the second well, the guard region is in direct contact with and concentric to the second concentric section in the second well, and the guard region has a different dopant concentration from the second concentric section in the second well.

20. The photodiode of claim 19, wherein the guard region has a bottom with a depth relative to the upper surface of the substrate, the depth of the guard region is the same as the third depth.

* * * * *